(12) United States Patent
Islam et al.

(10) Patent No.: US 6,727,755 B2
(45) Date of Patent: Apr. 27, 2004

(54) HIGH SPEED LINEAR VARIABLE GAIN AMPLIFIER ARCHITECTURE

(75) Inventors: Muhammad Islam, Dallas, TX (US); Herman Theodorus, Dallas, TX (US); Kambiz Hayat-Dawoodi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/014,730

(22) Filed: Dec. 10, 2001

(65) Prior Publication Data

US 2003/0107437 A1 Jun. 12, 2003

(51) Int. Cl.[7] ................................................. H03F 3/45
(52) U.S. Cl. ...................... 330/254; 330/259; 330/283
(58) Field of Search ............................. 330/254, 259, 330/260, 283; 327/359

(56) References Cited

U.S. PATENT DOCUMENTS 5,901,350 A * 5/1999 Stoichita et al. ........ 327/359 X
5,907,261 A * 5/1999 Jones ........................ 330/254

* cited by examiner

*Primary Examiner*—Steven J. Mottola
(74) *Attorney, Agent, or Firm*—W. Daniel Swayze, Jr.; W. James Brady; Frederick J. Telecky, Jr.

(57) ABSTRACT

A two stage amplifier circuit (10), the first stage (12) comprising a modified quad configuration and the second stage (14) comprising a translinear current amplifier configuration. The present invention achieves the advantages of fast response time, low distortion and improved bandwidth. The current gain of the second stage is represented by:

$$(IA_{out1} - IA_{out2})/(I_{out1} - I_{out2}) = (1 + R_{123}/R_{124}) \cdot (I_{135}/I_{134}) \cdot (A/(1+A))$$

where $A = g_{mQ109} \cdot R_{124}$.

6 Claims, 2 Drawing Sheets

HIGH SPEED LINEAR VARIABLE GAIN AMPLIFIER ARCHITECTURE

FIELD OF THE INVENTION

This invention relates to amplifiers and in particular, amplifiers having variable gain, large bandwidth and low distortion.

BACKGROUND OF THE INVENTION

Amplifiers are used to manipulate various signals within a circuit. The topology of the amplifier affects various operating aspects of the operating amplifier. For example, some amplifiers can deliver a high output current to a load. Other amplifiers can produce an output voltage swing that is approximately equal to the magnitude of the power supply of the amplifier circuit. Some amplifiers must provide an output with low cross-over distortion whereas other amplifiers are required to maintain gain and stability at high frequencies. These different requirements place constraints upon the design of the amplifier. It is often desirable in an amplifier circuit to have variable gain, large bandwidth and low distortion. Conventional solutions use attenuators as front ends followed by high gain, closed-loop amplifiers or multiple lower gain closed-loop amplifiers. Disadvantageously, these conventional solutions require much higher FT (factor of ten) amplification to achieve these results.

SUMMARY OF THE INVENTION

The present invention achieves technical advantages as a variable gain amplifier with wide bandwidth and low distortion by using two stages, a quad input stage with emitter degeneration and translinear current amplifier second stage.

The first stage quad configuration allows a constant DC output level. The output current of the quad is then fed into a resistance shunt current feedback amplifier with Darlington/level shift input stage to reduce transistor beta loading effects as well as allowing the largest dynamics out of the stage when a current to voltage and common mode feedback circuit are implemented in the same stage.

The second stage presents a low input impedance to the quad allowing optimization of the quad with minimize loss of bandwidth.

DETAILED DESCRIPTION OF THE PRESENT INVENTION

Figure 1:
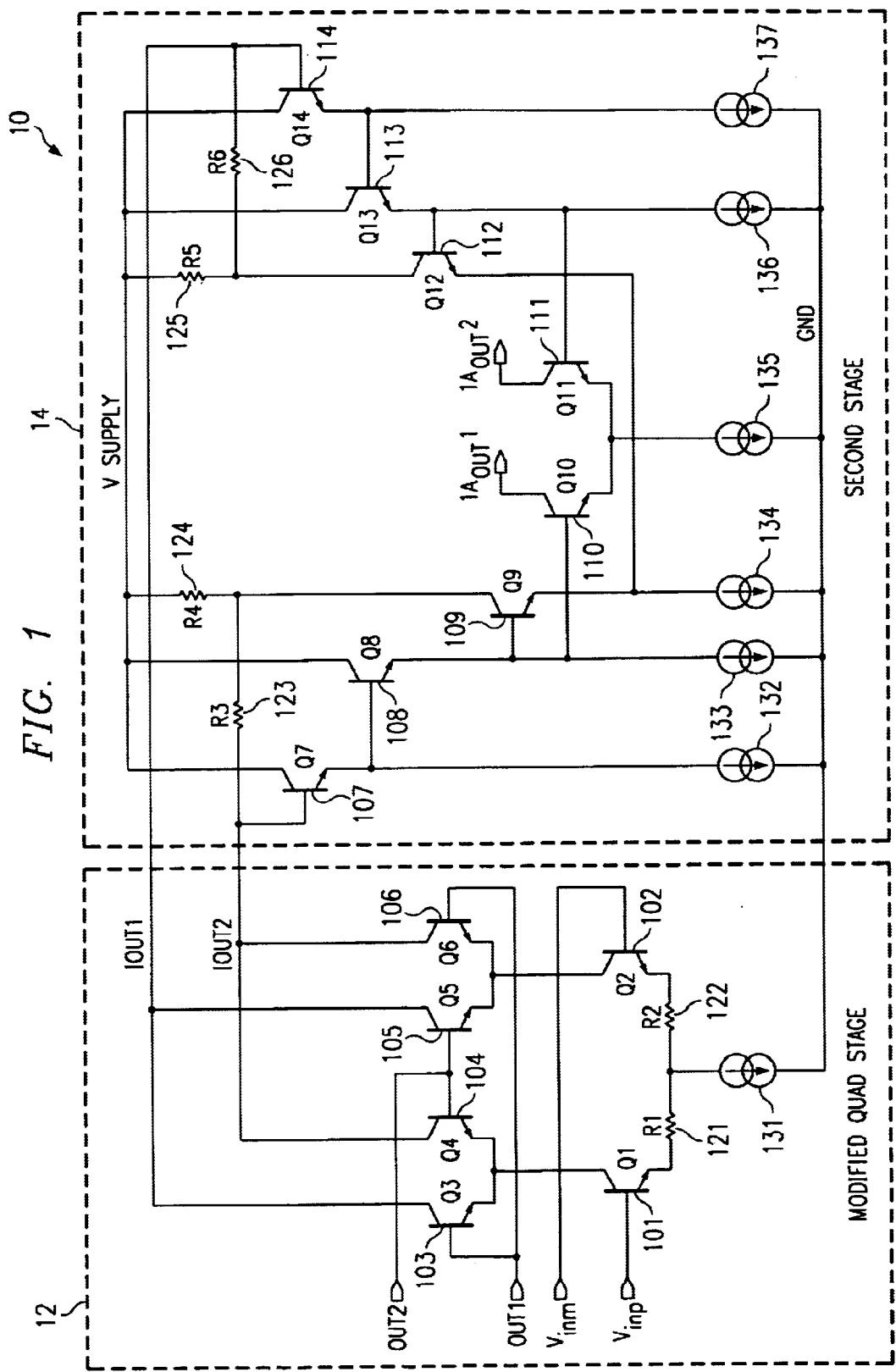
FIG. 1 is a schematic circuit diagram of the present invention.

The amplifier of the present invention, shown at 10 in FIG. 1, is a combination of a quad 12 current drive circuit and a translinear current amplifier 14. The quad 12 provides a constant DC output level. As used herein, quad refers to a series-parallel configuration of four transistors. The quad is modified with emitter degeneration. The output drive current of the quad 12 is fed into the translinear current amplifier 14 comprising a resistive shunt current feedback amplifier with Darlington/level shift input stage. This arrangement reduces transistor beta loading effects as well as allowing the largest dynamics out of the stage when a current to voltage and common mode feedback circuit are implemented in the same stage. Translinear loop transistors 109 ("$Q_{109}$"), 110 ("$Q_{110}$"), 111 ("$Q_{111}$") and 112 ("$Q_{112}$") ensure a fast conveyence of the collector currents of $Q_{109}$ ("$Q_{C109}$") and $Q_{112}$ ("$Q_{C112}$") to the output. The current gain of the second stage is given as follows:

$$(IA_{out1} - IA_{out2})/(I_{out1} - I_{out2}) = (1 + R_{123}/R_{124}) \cdot (I_{135}/I_{134}) \cdot (A/(1+A))$$

where $A = g_{mQ109} \cdot R_{124}$

The second stage 14 presents a low input impedance to the quad 12 allowing optimization of the quad 12 with minimum loss of bandwidth. Current to voltage conversion and common mode feedback implemented in the second stage 12 allows least delay, best distortion and highest bandwidth with such an architecture. The inherent all npn core variable gain amplifier 10 ensures the best possible bandwidth and flexibility of use on both all npn or complementary bipolar processes.

The equations below better illustrate the operation of the second stage.

Figure 2:
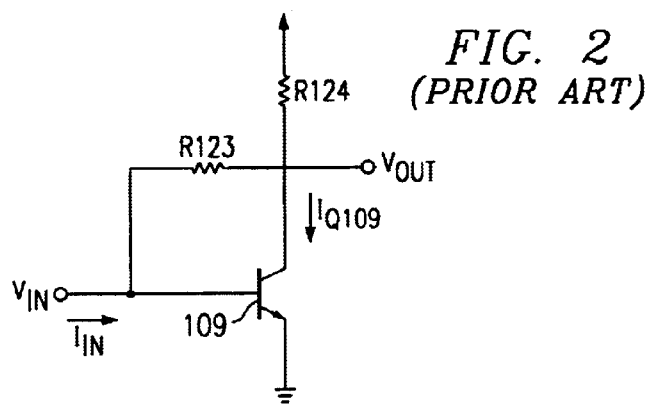
FIG. 2 is a schematic of a conventional npn current feedback topology.
Figure 3:
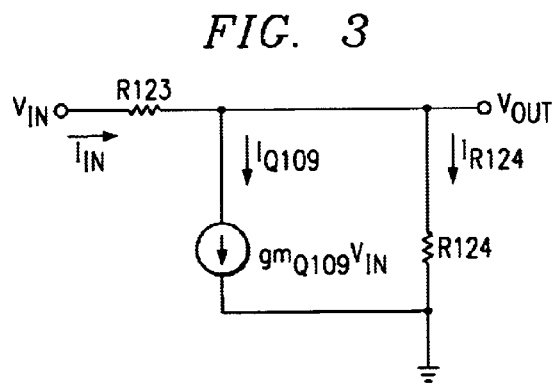
FIG. 3 is a a simplified equivalent circuit shown in FIG. 2.

FIG. 2 depicts a schematic of a conventional npn current feedback topology. From FIG. 3, we can derive the transfer function of FIG. 2. FIG. 3 is the equivalent circuit of FIG. 2.

$$\frac{I_{Q109}}{I_{in}}$$

1. $\dfrac{V_{in} - V_{out}}{R_{123}} = I_{in} \rightarrow V_{in} = V_{out} + I_{in} \cdot R_{123};$ 2. $\dfrac{V_{out}}{R_{124}} + I_{Q109} + \dfrac{V_{out} - V_{in}}{R_{123}} = 0;$ $I_{Q109} = g_{mQ109} \cdot V_{in}$ 3. $V_{in} = \dfrac{I_{Q109}}{g_{mQ109}}.$ Substituting equation (3) for equations (2) and (1) results in:

4. $\dfrac{I_{Q109}}{g_{mQ109}} = V_{out} + I_{in} R_{123} \rightarrow V_{out} = \dfrac{-I_{Q109}}{g_{mQ109}} - I_{in} \cdot R_{123}$ 5. $\dfrac{V_{out}}{R_{124}} + I_{Q109} + \dfrac{V_{out} - \dfrac{I_{Q109}}{g_{mQ109}}}{R_{123}} = 0$ Substituting equation (4) for (5) and solving for $$\frac{I_{Q109}}{I_{in}}$$

provides as follows:

$$\frac{I_{Q109}}{I_{in}} = \frac{g_{mQ109}(R_{123} + R_{124})}{1 + g_{mQ109} \cdot R_{124}}$$

$$= \frac{(g_{mQ109} \cdot R_{124})}{1 + g_{mQ109} \cdot R_{124}} \frac{(R_{123} + R_{124})}{R_{124}}$$

$$\frac{I_{Q109}}{I_{in}} = \frac{A}{1+A}\left(1 + \frac{R_{123}}{R_{124}}\right) \text{ where } A = g_{mQ109} \cdot R_{124}$$

Figure 4:
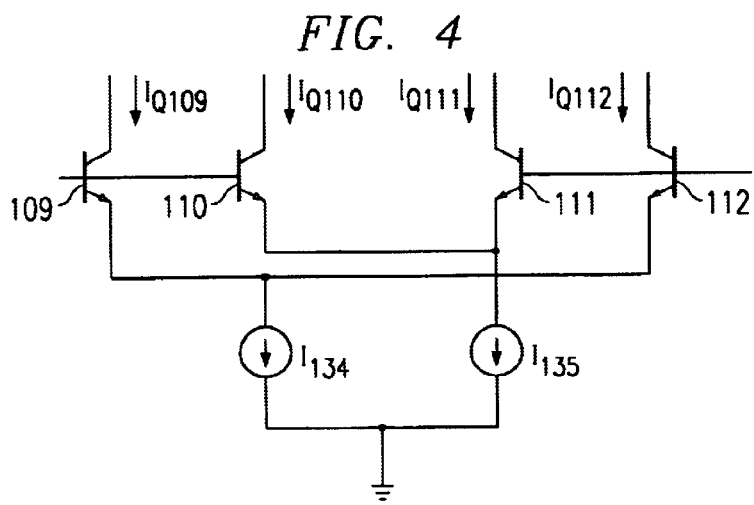
FIG. 4 is a schematic circuit diagram of the translinear loop ($Q_{109}$ to $Q_{112}$) of the second stage of the present invention.

Referencing FIG. 4, we can derive the transfer function for the translinear loop:

6. $V_{be108} - V_{be112} + V_{be111} - V_{be110} = 0$ $$V_{Tin}\left(\frac{I_{Q109}}{I_s}\right) - V_{Tin}\left(\frac{I_{Q112}}{I_s}\right) + V_{Tin}\left(\frac{I_{Q111}}{I_s}\right) - V_{Tin}\left(\frac{I_{Q110}}{I_s}\right) = 0$$

$$\frac{I_{Q109}}{I_{Q112}} \cdot \frac{I_{Q111}}{I_{Q110}} \rightarrow I_{Q109} \cdot I_{Q111} = I_{Q110} \cdot I_{Q112}$$

$I_{Q109} + I_{Q112} = I_{134} \rightarrow I_{Q112} = I_{134} - I_{Q109}$  7.

$I_{Q110} + I_{Q111} = I_{135} \rightarrow I_{Q111} = I_{135} - I_{Q110}$  8.

Substituting equation (7) and (8) for (6):

$I_{Q109}(I_{135} - I_{Q110}) = I_{Q110}(I_{134} - I_{Q109})$ $(I_{Q109} \cdot I_{135}) - (I_{Q109} \cdot I_{Q110}) = (I_{Q110} \cdot I_{134}) - (I_{Q109} \cdot I_{Q110})$ $I_{Q109} \cdot I_{135} = I_{Q110} \cdot I_{134}$ $$\frac{I_{Q110}}{I_{Q109}} = \frac{I_{135}}{I_{134}}$$

By combining the derivation of the transfer functions of FIGS. 3 and 4, we obtain:

$$I_{Q110} = I_{out} \rightarrow \frac{I_{out}}{I_{Q109}} = \frac{I_{135}}{I_{Q134}};$$

Then $\dfrac{I_{out}}{I_{in}} = \dfrac{I_{out}}{I_{Q109}} \cdot \dfrac{I_{Q109}}{I_{in}};$ $$\frac{I_{out}}{I_{Q109}} \cdot \frac{I_{Q109}}{I_{in}} = \frac{I_{135}}{I_{134}} \cdot \frac{T}{1+T}\left(1 + \frac{R_{123}}{R_{124}}\right);$$

Therefore: $\dfrac{I_{out}}{I_{in}} = \left(1 + \dfrac{R_{123}}{R_{124}}\right)\left(\dfrac{R_{135}}{R_{134}}\right)\left(\dfrac{A}{1+A}\right)$ where $A = g_m \cdot I_{Q109} \cdot R_{124}$

What is claimed is:

1. An amplifier circuit, comprising:

a first stage and a second stage, the first stage comprising a quad configuration and the second stage comprising a translinear current amplifier configuration; and a coupling circuit operably coupling the first stage and the second stage, wherein the current gain of the second stage is given by:

$(IA_{out1} - IA_{out2})/(I_{out1} - I_{out2}) = (1 + R_{123}/R_{124}) \cdot (I_{135}/I_{134}) \cdot (A/(1+A))$ where $A = g_{m\ Q109} \cdot R_{124}$;

$IA_{out1}$ is the amplified output collector current from $Q_{110}$;

$IA_{out2}$ is the output collector current from transistor $Q_{111}$;

$I_{out1}$ is the output current from $Q_{103}$ and $Q_{105}$ from the first stage quad, and $I_{out2}$ is the collector current from $Q_{104}$ and $Q_{106}$ from the first stage quad;

$R_{123}$ is the resistance value of the third resistor and $R_{124}$ is the resistance value of the fourth resistor;

$I_{135}$ is the current through the fifth current source; and $I_{134}$ is the value of the current through the fourth current source.

2. The amplifier circuit recited in claim 1, wherein the first stage quad configuration is modified using emitter degeneration.

3. The amplifier circuit recited in claim 1, further comprising current to voltage conversion and common mode feedback in the second stage operable to provide high speed, low distortion and extended bandwidth.

4. The amplifier circuit recited in claim 1, wherein the amplifier is formed of bipolar devices.

5. The amplifier circuit recited in claim 1 being adapted for use in an integrated circuit.

6. The amplifier circuit recited in claim 1 being adapted for use in a variable gain amplifier.

* * * * *